United States Patent
Kim et al.

(10) Patent No.: US 9,491,550 B2
(45) Date of Patent: Nov. 8, 2016

(54) PIEZOELECTRIC STACK TRANSDUCER

(71) Applicant: Foundation of Soongsil University-Industry Cooperation, Seoul (KR)

(72) Inventors: Jin Oh Kim, Seoul (KR); Dae Jong Kim, Gyeonggi-Do (KR)

(73) Assignee: Foundation of Soongsil University-Industry Cooperation, Seoul (KR)

( * ) Notice: Subject to any disclaimer, the term of this patent is extended or adjusted under 35 U.S.C. 154(b) by 338 days.

(21) Appl. No.: 14/100,299

(22) Filed: Dec. 9, 2013

(65) Prior Publication Data

US 2014/0184021 A1 Jul. 3, 2014

(30) Foreign Application Priority Data

Jan. 3, 2013 (KR) .................. 10-2013-0000487

(51) Int. Cl.
*H03H 9/15* (2006.01)
*H04R 17/10* (2006.01)
*H04R 1/24* (2006.01)

(52) U.S. Cl.
CPC ............... *H04R 17/10* (2013.01); *H03H 9/15* (2013.01); *H04R 1/24* (2013.01)

(58) Field of Classification Search
CPC ............ H01L 41/083; H01L 41/0833; B06B 1/0611; B06B 1/0614; H04R 17/10; H03H 9/15

USPC .................. 310/321, 322, 320, 367, 369
See application file for complete search history.

(56) References Cited

U.S. PATENT DOCUMENTS 4,972,389 A * 11/1990 Teel .................. B06B 1/0607
                                              310/337

FOREIGN PATENT DOCUMENTS

| JP | 2007-244638 A | 9/2007 |
| JP | 2008-256597 A | 10/2008 |
| JP | 2010-504782 A | 2/2010 |
| KR | 10-2011-0064511 A | 6/2011 |

* cited by examiner

*Primary Examiner* — Derek Rosenau
(74) *Attorney, Agent, or Firm* — Novick, Kim & Lee, PLLC; Sang Ho Lee

(57) ABSTRACT

Provided is a piezoelectric stack transducer. In a transducer portion, a plurality of piezoelectric transducers which output maximum amplitude at different frequencies are continuously stacked. A stacked electrode portion is provided on both surfaces of each of the plurality of continuously stacked piezoelectric transducers and supplies an electric signal so that vibration is generated. In this case, the plurality of piezoelectric transducers have different diameters. According to the present invention, it is possible to implement a piezoelectric stack transducer which exhibits constant amplitude (output) at different frequencies by piezoelectric transducers exhibiting different amplitudes at respective frequencies according to natural frequencies supplementing amplitude of a different piezoelectric transducer.

10 Claims, 5 Drawing Sheets

(a)

(b)

(c)

PIEZOELECTRIC STACK TRANSDUCER

CROSS-REFERENCE TO RELATED APPLICATION

This application claims priority to and the benefit of Korean Patent Application No. 10-2013-0000487, filed on Jan. 3, 2013, the disclosure of which is incorporated herein by reference in its entirety.

BACKGROUND

1. Field of the Invention

The present invention relates to a piezoelectric stack transducer, and more specifically, to a piezoelectric stack transducer having constant output at several specific frequencies.

2. Discussion of Related Art

FIG. 1 is a diagram illustrating a conventional piezoelectric stack transducer. Referring to FIG. 1, the conventional piezoelectric stack transducer is implemented in such a manner that a plurality of piezoelectric transducers with the same thickness, diameter and material are stacked. Such a conventional piezoelectric stack transducer outputs maximum amplitude at a specific frequency and outputs reduced amplitude at frequencies other than the specific frequency, thereby resulting in greatly degraded performance.

Related prior arts will be described in detail. A piezoelectric ceramic-polymer composite capable of improving a size in a longitudinal vibration mode of a signal layer instead of restricting the size in the longitudinal vibration mode of the signal layer by forming a piezoelectric ceramic plate in a multi-layer structure having an internal electrode is disclosed in Korean Patent Laid-open Publication No. 2008-0000010 (Title: 2-2 Piezoelectric Composite Ultrasonic Oscillator having Multi-layer Structure and Method of Manufacturing The Same).

Further, a piezoelectric transducer including a piezoelectric element and an electrode, which is implanted in a middleear and converts an electrical signal corresponding to sound to a vibration signal to transfer the vibration signal to an internal ear is disclosed in Korean Patent Laid-open Publication No. 2005-0039444 (Title: Multilayer Type Piezoelectric Transducer for Middleear Implant System).

SUMMARY OF THE INVENTION

An object of the present invention is to provide a piezoelectric stack transducer which exhibits constant amplitude at several specific frequencies through an amplitude change of a piezoelectric transducer and another piezoelectric transducer exhibiting maximum amplitude at a specific frequency using a plurality of piezoelectric transducers having different diameters.

In order to achieve the above object, a piezoelectric stack transducer according to the present invention includes a transducer portion in which a plurality of piezoelectric transducers which output maximum amplitude at different frequencies are continuously stacked; and a stacked electrode portion which is provided on both surfaces of each of the plurality of continuously stacked piezoelectric transducers and supplies an electric signal so that vibration is generated, wherein the plurality of piezoelectric transducers have different diameters.

According to the piezoelectric stack transducer of the present invention, it is possible to implement a piezoelectric stack transducer which exhibits constant amplitude (output) at several frequencies by piezoelectric transducers exhibiting different amplitudes at respective frequencies according to a natural frequency supplementing amplitudes of different transducers.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, a preferred exemplary embodiment of a piezoelectric stack transducer according to the present invention will be described in detail with reference to the accompanying drawings.

Figure 1:
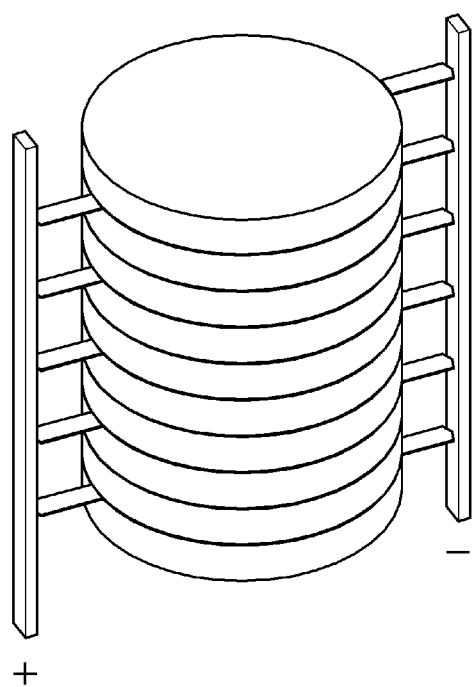
FIG. 1 is a diagram illustrating a conventional piezoelectric stack transducer.
Figure 2:
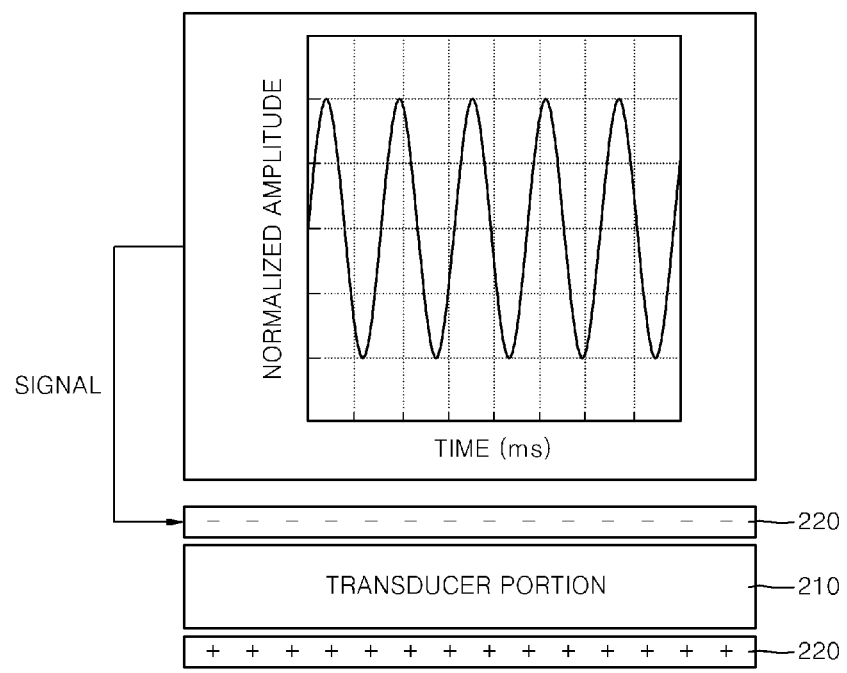
FIG. 2 is a block diagram illustrating a configuration of a piezoelectric stack transducer according to a preferred exemplary embodiment of the present invention.

FIG. 2 is a block diagram illustrating a configuration of a piezoelectric stack transducer according to a preferred exemplary embodiment of the present invention. Referring to FIG. 2, the piezoelectric stack transducer according to the present invention includes a transducer portion 210 and a stacked electrode portion 220.

In the transducer portion 210, a plurality of piezoelectric transducers which output maximum amplitude at different frequencies are continuously stacked. In this case, the plurality of stacked piezoelectric transducers have different diameters. The plurality of piezoelectric transducers having the different diameters have a ring form and may be fixed by a bolt passing through their centers. The stacked electrode portion 220 is provided on both surfaces of each of the plurality of continuously stacked piezoelectric transducers, supplying an electric signal so that vibration is generated.

The transducer portion 210 receives the electric signal having a specific frequency supplied from the stacked electrode portion 220, and the plurality of piezoelectric transducers have different natural frequencies and output different amplitudes. Further, a first piezoelectric transducer generating maximum amplitude among the plurality of piezoelectric transducers, which output different amplitudes at respective frequencies according to different natural frequencies, supplements amplitude of another second piezoelectric transducer, such that constant amplitude can be exhibited at different frequencies.

Figure 3:
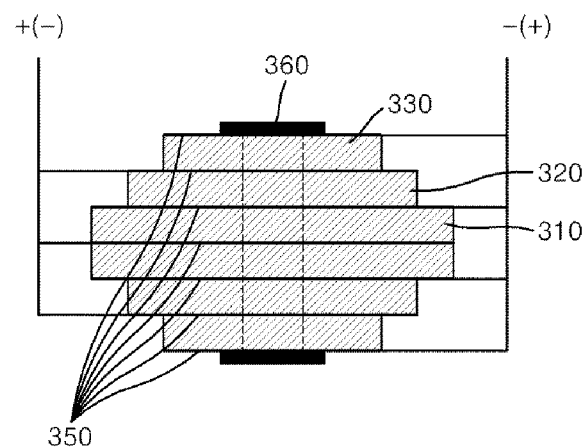
FIGS. 3 to 5 are diagrams illustrating an exemplary embodiment in which the piezoelectric stack transducer according to the present invention is implemented.
Figure 4:
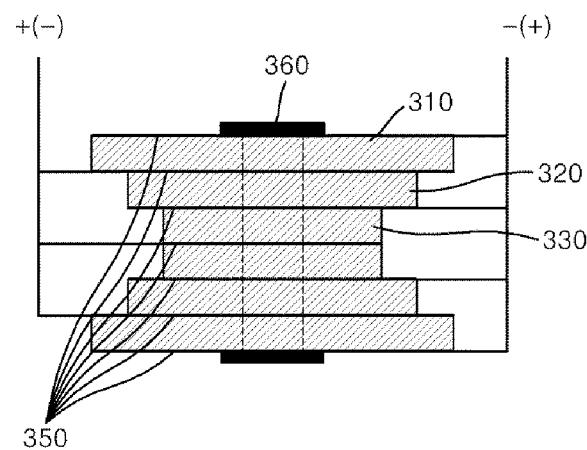
Figure 5:
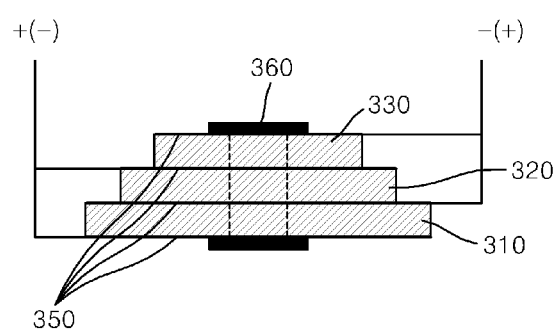

Specifically, referring to FIGS. 3 to 5, in the transducer portion 210, a plurality of piezoelectric transducers 310, 320 and 330 having different diameters are continuously stacked. In this case, the piezoelectric transducer 330 refers to a piezoelectric transducer having maximum amplitude at a high frequency, the piezoelectric transducer 310 refers to a piezoelectric transducer having maximum amplitude at a low frequency, and the piezoelectric transducer 320 refers to a piezoelectric transducer having maximum amplitude at an intermediate frequency. Further, the number of continuously stacked piezoelectric transducers is not limited to the illustration of FIGS. 3 to 5.

A stacked electrode portion 350 is implemented to supply an electric signal to both surfaces of each of the plurality of continuously stacked piezoelectric transducers 310, 320 and 330. Further, a fixing portion for fixing the plurality of piezoelectric transducers 310, 320 and 330 having different diameters is formed of a bolt 360 which fixes the piezoelectric transducers 310, 320 and 330 in a ring form by passing through their centers.

In other words, in the piezoelectric stack transducer according to the present invention, diameters of the plurality of piezoelectric transducers 310, 320 and 330 are set to differ from one another such that specific frequencies yielding the maximum amplitude differ. Also, as described above, the stacked electrode portion 350 is provided on both surfaces of each of the plurality of piezoelectric transducers 310, 320 and 330 such that vibration is generated according to a transferred electric signal. In this case, the electric signal input to the stacked electrode portion 350 has several frequency components. The plurality of piezoelectric transducers 310, 320 and 330 have different values of natural frequencies through the frequencies of the electric signal transferred via the stacked electrode portion 350, and output different amplitudes.

Accordingly, according to the piezoelectric stack transducer of the present invention, the plurality of piezoelectric transducers 310, 320 and 330 exhibiting different amplitudes at respective frequencies according to the natural frequencies mutually supplement the output amplitudes such that the output amplitude may be maintained to be constant irrespective of a change in the frequency. As a result, the piezoelectric stack transducer according to the present invention may be used for an apparatus requiring a constant output irrespective of the frequency change, such as a car engine injector.

Conventionally, a principle of generating a large displacement by applying a voltage to piezoelectric transducers having the same diameter has been used. The maximum amplitude is obtained at a specific frequency, but there is a disadvantage in that the displacement is greatly reduced at other frequencies. Accordingly, the present invention is intended to implement a stack transducer having several frequencies yielding the maximum amplitude rather than a stack transducer having one frequency yielding the maximum amplitude.

Figure 6:
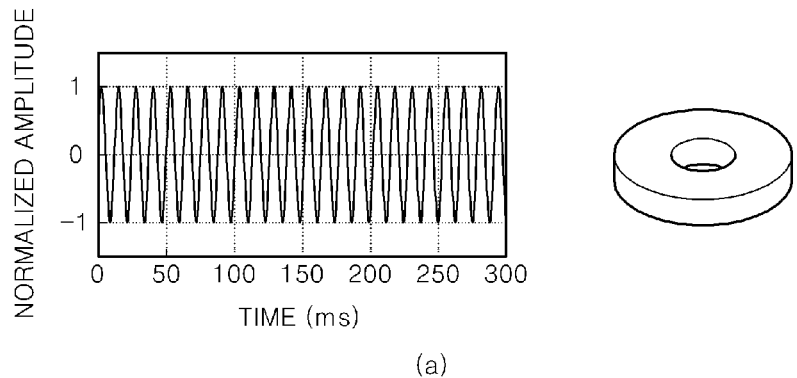
FIG. 6 is a diagram illustrating a principle of the piezoelectric stack transducer according to the present invention.
Figure 6:
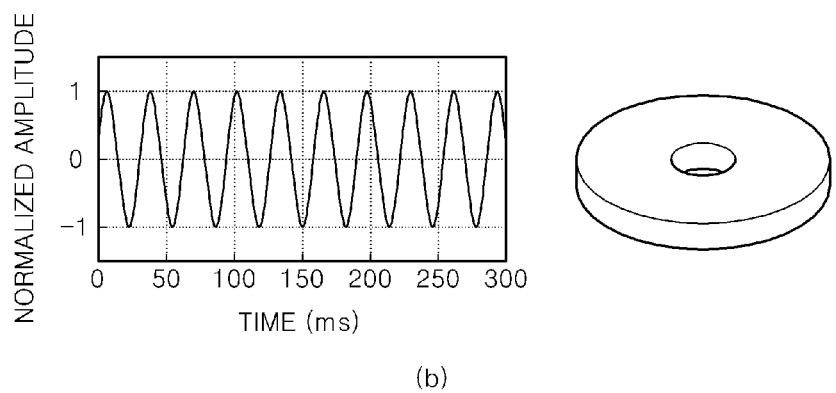
Figure 6:
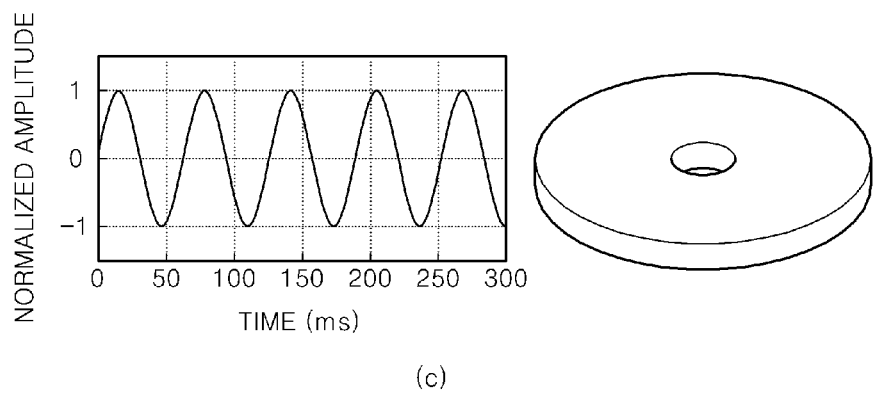

FIG. 6 is a diagram illustrating a principle of the piezoelectric stack transducer according to the present invention. FIG. 6(a) illustrates the piezoelectric transducer 330 of FIG. 3 and output amplitude of the piezoelectric transducer 330, FIG. 6(b) illustrates the piezoelectric transducer 320 of FIG. 3 and output amplitude of the piezoelectric transducer 320, and FIG. 6(c) illustrates the piezoelectric transducer 310 of FIG. 3 and output amplitude of the piezoelectric transducer 310.

In the case of piezoelectric transducers with the same shape, thickness, and material, frequencies yielding maximum amplitude are differently determined according to their diameters. Further, the piezoelectric transducer is excited by a vibrating electric signal and repeats expansion and contraction at the same frequency as the frequency of the signal. Also, when the piezoelectric transducer is excited by a signal at a frequency corresponding to the natural frequency of the piezoelectric transducer, an expansion and contraction displacement is maximized Meanwhile, the natural frequency of the output amplitude of the piezoelectric transducer becomes low as a radius of the piezoelectric transducer increases.

Referring to FIG. 6(a), the piezoelectric transducer 330 is a piezoelectric transducer having a shortest radius among the plurality of continuously stacked piezoelectric transducers, and has a highest natural frequency. Referring to FIG. 6(b), the piezoelectric transducer 320 is a piezoelectric transducer having a substantially intermediate radius among the plurality of continuously stacked piezoelectric transducers, and has a natural frequency between the natural frequency of the piezoelectric transducer 330 and a natural frequency of another piezoelectric transducer 310. Lastly, referring to FIG. 6(c), the piezoelectric transducer 310 is a piezoelectric transducer having a largest radius among the plurality of continuously stacked piezoelectric transducers, and has a lowest natural frequency.

As described above, since the piezoelectric transducers 310, 320 and 330 with the same shape, thickness, and material have different radiuses, the frequencies yielding the maximum amplitude are differently determined. The plurality of piezoelectric transducers 310, 320 and 330 generate vibrations according to an electric signal transferred via the stacked electrode portion 350, and the electric signal input to the stacked electrode portion 350 has several frequency components, as necessary. Also, the respective piezoelectric transducers 310, 320 and 330 have different natural frequency values according to frequencies of the electric signal transferred via the stacked electrode portion 350, and output maximum displacement amplitude at different frequencies. In this case, it may be seen that an output frequency is equal to the frequency of the electric signal input via the stacked electrode portion 350, and the output amplitude is differently outputted according to the respective piezoelectric transducers 310, 320 and 330. In other words, it is possible to implement the piezoelectric stack transducer according to the present invention so that constant output amplitude may be obtained at several frequencies by adjusting the number of piezoelectric transducers having different diameters.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:
1. A piezoelectric stack transducer comprising:
a transducer portion comprising a plurality of piezoelectric transducers, wherein the plurality of piezoelectric transducers are continuously stacked and each of the plurality of piezoelectric transducers has a circular cross-section shape; and
a stacked electrode portion coupled to each of the plurality of piezoelectric transducers, wherein the stacked electrode portion supplies an electric signal having a first frequency to all of the plurality of piezoelectric transducers, wherein a natural frequency of each of the plurality of piezoelectric transducers is determined by a diameter of the each of the plurality of piezoelectric transducers, and wherein at least two of the plurality of piezoelectric transducers have different diameters from one another, and the transducer portion outputs a constant amplitude.

2. The piezoelectric stack transducer according to claim 1, further comprising a fixing portion fixing the plurality of piezoelectric transducers.

3. The piezoelectric stack transducer according to claim 2, wherein the fixing portion is a bolt which fixes the plurality of piezoelectric transducers by passing through their centers.

4. The piezoelectric stack transducer according to claim 1, wherein the transducer portion outputs the constant amplitude at the first frequency, wherein the first frequency is a time-variant frequency.

5. The piezoelectric stack transducer according to claim 1, wherein the plurality of piezoelectric transducers have at least a first piezoelectric transducer having a first radius, a second piezoelectric transducer having a second radius, and a third piezoelectric transducer having a third radius, wherein the first, second, third piezoelectric transducers have different diameters thereof and different natural frequencies, and wherein the transducer portion outputs the constant amplitude at the first frequency, wherein the first frequency is a time-variant frequency.

6. The piezoelectric stack transducer according to claim 3, wherein each of the plurality of piezoelectric transducers has a same shape, a same thickness, and a same material.

7. The piezoelectric stack transducer of claim 3, wherein the fixing bolt includes a first end, a second end, and a centermost position being disposed between the first end and the second end, and wherein a first piezoelectric transducer having a largest diameter is located at the centermost position of the fixing bolt, and the diameter of the each of the plurality of piezoelectric transducers decreases from the centermost position to the first end and second end, respectively.

8. The piezoelectric stack transducer of claim 3, wherein the fixing bolt includes a first end, a second end, and a centermost position being disposed between the first end and the second end, and wherein a first piezoelectric transducer having a smallest diameter is located at the centermost position, and the diameter of the each of the plurality of piezoelectric transducers increases from the centermost position to the first end and second end, respectively.

9. The piezoelectric stack transducer of claim 3, wherein the fixing bolt includes a first end and a second end, and a first piezoelectric transducer having a smallest diameter is located at the first end, and a second piezoelectric transducer having a largest diameter is located at the second end.

10. The piezoelectric stack transducer of claim 9, wherein the diameter of the each of the plurality of piezoelectric transducers increases from the first end to the second end.

* * * * *